(12) United States Patent
Ying et al.

(10) Patent No.: US 6,541,385 B2
(45) Date of Patent: Apr. 1, 2003

(54) METHOD FOR PLASMA ETCHING OF IR-TA-O ELECTRODE AND FOR POST-ETCH CLEANING

(75) Inventors: Hong Ying, San Jose, CA (US); Fengyan Zhang, Vancouver, WA (US); Jer-Shen Maa, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 29 days.

(21) Appl. No.: 09/855,393

(22) Filed: May 14, 2001

(65) Prior Publication Data
US 2002/0187645 A1 Dec. 12, 2002

(51) Int. Cl.⁷ .............................................. H01L 21/302
(52) U.S. Cl. ...................... 438/706; 438/708; 438/711; 438/714; 438/720; 438/726
(58) Field of Search ................................. 438/706, 708, 438/711, 714, 720, 726, 727, 742

(56) References Cited

U.S. PATENT DOCUMENTS

| 5,008,687 | A | | 4/1991 | Longman et al. ......... 346/135.1 |
| 5,708,284 | A | | 1/1998 | Onishi ........................ 257/295 |
| 5,793,057 | A | | 8/1998 | Summerfelt ................. 257/55 |
| 5,854,107 | A | | 12/1998 | Park et al. ................... 438/254 |
| 6,368,518 | B1 | * | 4/2001 | Vaartstra ...................... 216/67 |
| 6,261,967 | B1 | * | 7/2001 | Athavale et al. ............. 438/717 |
| 6,368,517 | B1 | * | 4/2002 | Hwang et al. ................ 216/67 |

OTHER PUBLICATIONS

Article entitled, "Improvement of Ta Diffusion Barrier Performance in Cu Metallization by Insertion of a Thin Zr Layer Into Ta Film", by J.S. Kwak and H.K. Baik, published in Applied Physics Letters, vol. 72, No. 22, pp 2832–2834.
Article entitled, "Investigation of Pt/Ta Diffusion Barrier Using Hybrid Conductive Oxide ($RuO_2$) for High Dielectric Applications" by D–S. Yoon and H. K. Baik, published in J. Vac. Sci. Technol. B 16(3), May/Jun. 1998, pp 1137–1141.
Article entitled, "Oxidation Resistance of Tantalum–Ruthenium Dioxide Diffusion Barrier for Memory Capacitor Bottom Electrodes" by D–S Y, H.K. Baik, S–M Lee, C–S Park and S–I Lee, published in Applied Physics Letters, vol. 73, No. 3, Jul. 1998, pp 324–326.
Article entitled, "Oxide ($CeO_2$)–incorporated new diffusion barrier for Cu metallization" by D–S Yoon, S–M Lee and H. K. Baik, published in 1998 Materials Research Society, Conference Proceedings ULSI XIII, pp 103–109.

* cited by examiner

Primary Examiner—Robert Kunemund
Assistant Examiner—Binh X. Tran
(74) Attorney, Agent, or Firm—Matthew D. Rabdau; David C. Ripma; Scott C. Krieger

(57) ABSTRACT

A method of forming an electrode in an integrated circuit includes preparing a silicon-base substrate, including forming semiconductor structures on the substrate to form an integrated substrate structure; depositing a layer of electrode material on a substrate structure; patterning the layer of electrode material to form electrode elements, wherein said patterning includes plasma etching the layer of electrode material in a plasma reactor in an etching gas atmosphere having a fluorine component therein; and cleaning the substrate structure and electrode elements in a distilled water bath.

17 Claims, 4 Drawing Sheets

METHOD FOR PLASMA ETCHING OF IR-TA-O ELECTRODE AND FOR POST-ETCH CLEANING

RELATED APPLICATIONS

This application is related to application Serial No. 09/263,970, filed March 5, 1999, for Iridium composite barrier structure and method for same.

FIELD OF THE INVENTION

This invention relates to etching of electrode in integrated circuits, and specifically to a method of plasma etching an iridium—tantalum—oxide electrode in a ferroelectric integrated circuit, and a method for cleaning the etching debris.

BACKGROUND OF THE INVENTION

Electrodes used in ferroelectric devices are usually formed from platinum or iridium, and are generally etched using ion milling or chlorine-based chemistries. Etching is usually preceded by physical sputtering, but occasionally may be preceded by plasma-assisted chemical etching. Such processes result in a low etching rate, poor selectivity in that the etching removes materials not intended to be removed, and re-deposition of etch-removed materials. Poor sidewall profiles are also frequent occurrences.

SUMMARY OF THE INVENTION

A method of forming an electrode in an integrated circuit includes preparing a silicon-base substrate, including forming semiconductor structures on the substrate to form an integrated substrate structure; depositing a layer of electrode material on a substrate structure; patterning the layer of electrode material to form electrode elements, wherein said patterning includes plasma etching the layer of electrode material in a plasma reactor in an etching gas atmosphere having a fluorine component therein; and cleaning the substrate structure and electrode elements in a distilled water bath.

It is an object of the invention to provide accurate patterning of Ir-Ta-O electrodes.

Another object of the invention is to provide a method of rapid etching of an electrode in a ferroelectric device.

A further object of the invention is to provide a reliable manufacturing process for Ir-Ta-O electrodes when used with ferroelectric devices.

Another object of the invention is to provide a method for removing etching debris from the structure.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Etching using the method of the invention may incorporate use of any state-of-the-art high density plasma reactor. One such reactor is an Electron Cyclotron Resonance (ECR) plasma reactor. In the ECR reactor, ion density and ion energy may be separately controlled by adjusting the ECR microwave power and the RF bias power, respectively. Etching parameters are set forth in Table 1, which depicts the parameter ranges and the specific parameters used for the examples described herein.

TABLE 1

| Process Variables | Parameter Ranges | Example Parameters |
| --- | --- | --- |
| Total Gas Flow | 20 sccm~100 sccm | 60 sccm |
| Process Pressure | 5 mTorr~50 mTorr | 6 mTorr |
| Microwave Power | 300 W~1000 W | 600 W |
| Substrate RF Bias Power | 50 W~1000 W | 200 W |
| Substrate Temperature | −50° C.~200° C. | Ambient Room Temperature |

The method of the invention may be used in electrode etching during the fabrication of integrated circuits, and particularly in the fabrication of ferroelectric devices. The fabrication process includes the usual steps of preparing a substrate, from bulk silicon or SIMOX silicon substrate, building a semiconductor device by forming active regions in the substrate and by forming various layers of material on the substrate. One such layer may be a metal layer for use as electrodes, such as Ir-Ta-O.

Figure 1:
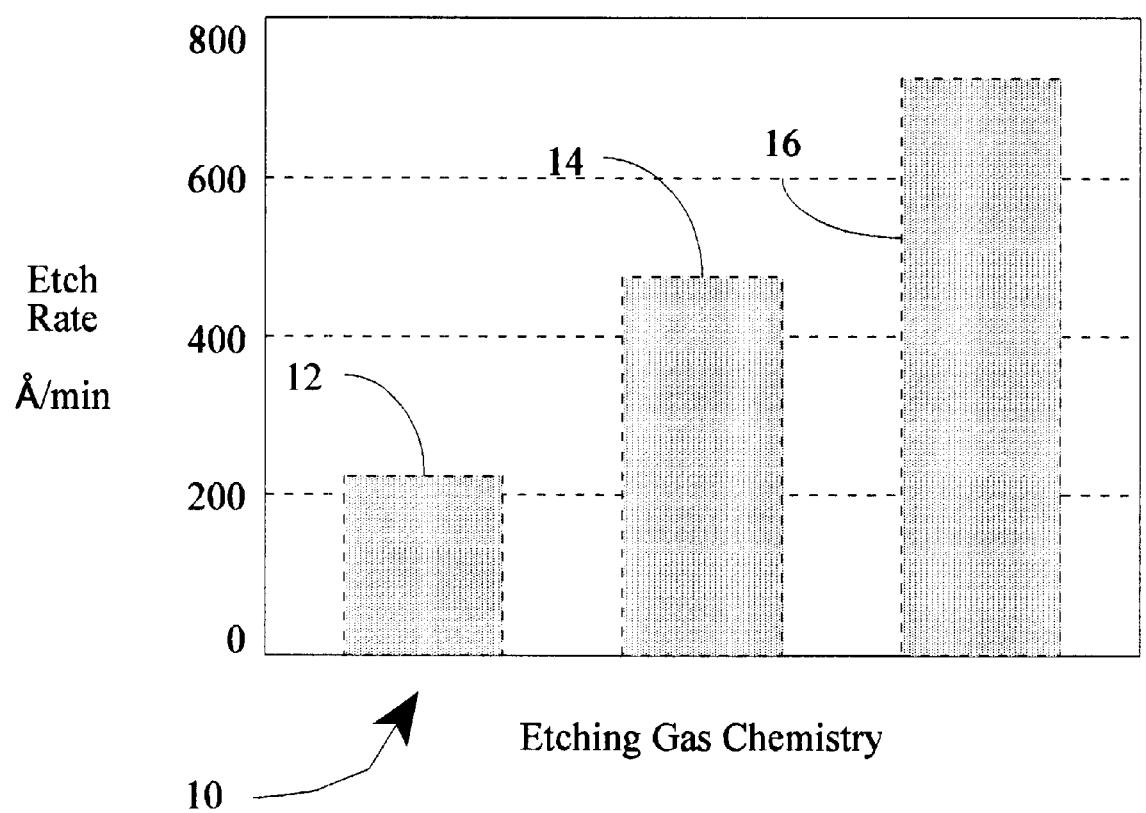
FIG. 1 is a graph depicting etching gas chemistries as used in the method of the invention.

As previously noted, chlorine gas chemistries are generally used in etching processes for Ir-Ta-O electrodes. The use of various etch gas chemistries resulted in significantly different etch rates, as shown in FIG. 1, generally at 10. Etching using a $Cl_2/O_2/Ar$ gas chemistry, at a flow rate of 30/5/25 sccm, results in an etch rate 12 less than half of that of a gas chemistry incorporating fluorine. Intermediate results, 14, were obtained from a $CF_4/O_2/Ar$ gas chemistry at a flow rate of 30/5/25 sccm. The use of a gas having a fluorine component, such as $CF_4$, mixed with $O_2$, at a 55 sccm/5 sccm flow rate, resulted in the highest etch rate 16. Other suitable fluorine gas chemistries include $CHF_3$, $C_2F_6$, $SF_6$ and $NF_3$, in combination with oxygen and an inert gas component, such as argon. Physical sputtering is not required to obtain the results shown in FIG. 1, and the etch process may be preceded by a plasma-assisted chemical etch process.

Figure 2:
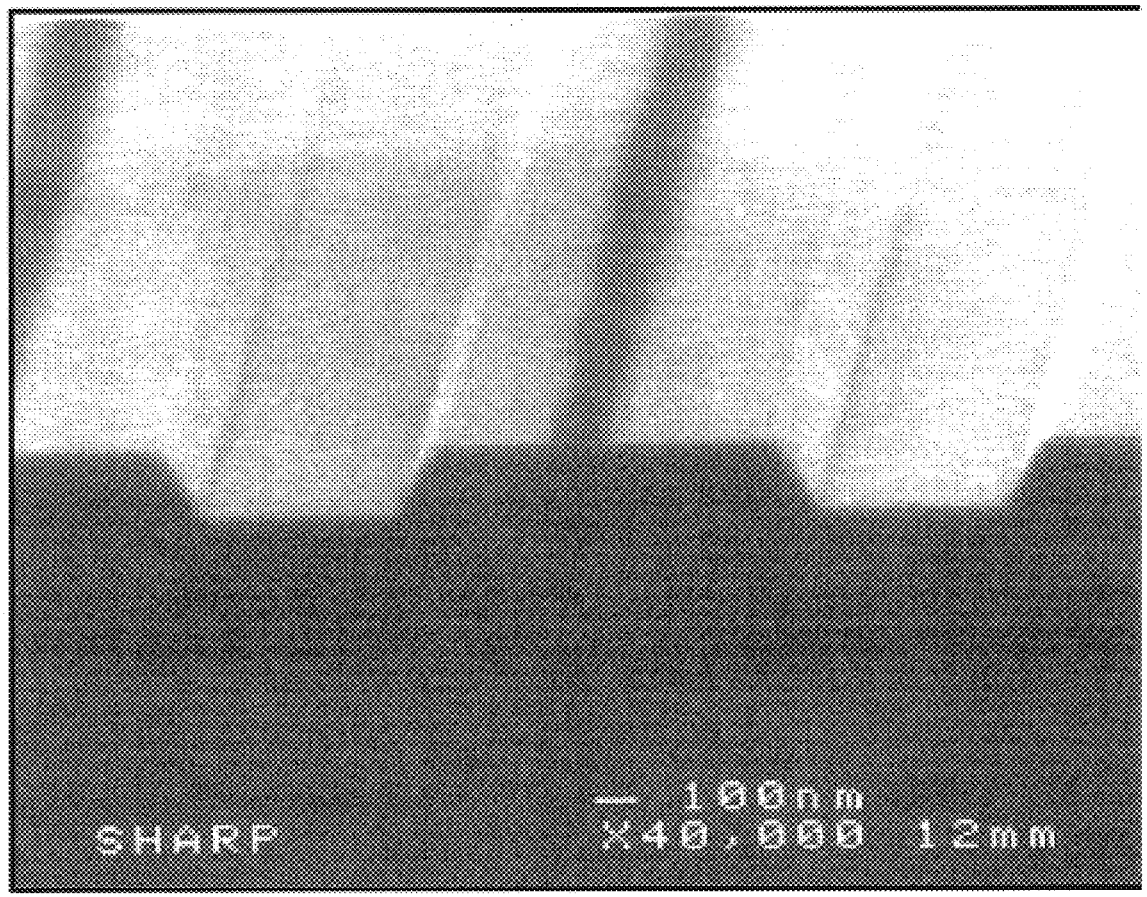
FIGS. 2–4 are cross section microphotographs of ferroelectric devices constructed according to the method of the invention.
Figure 3:
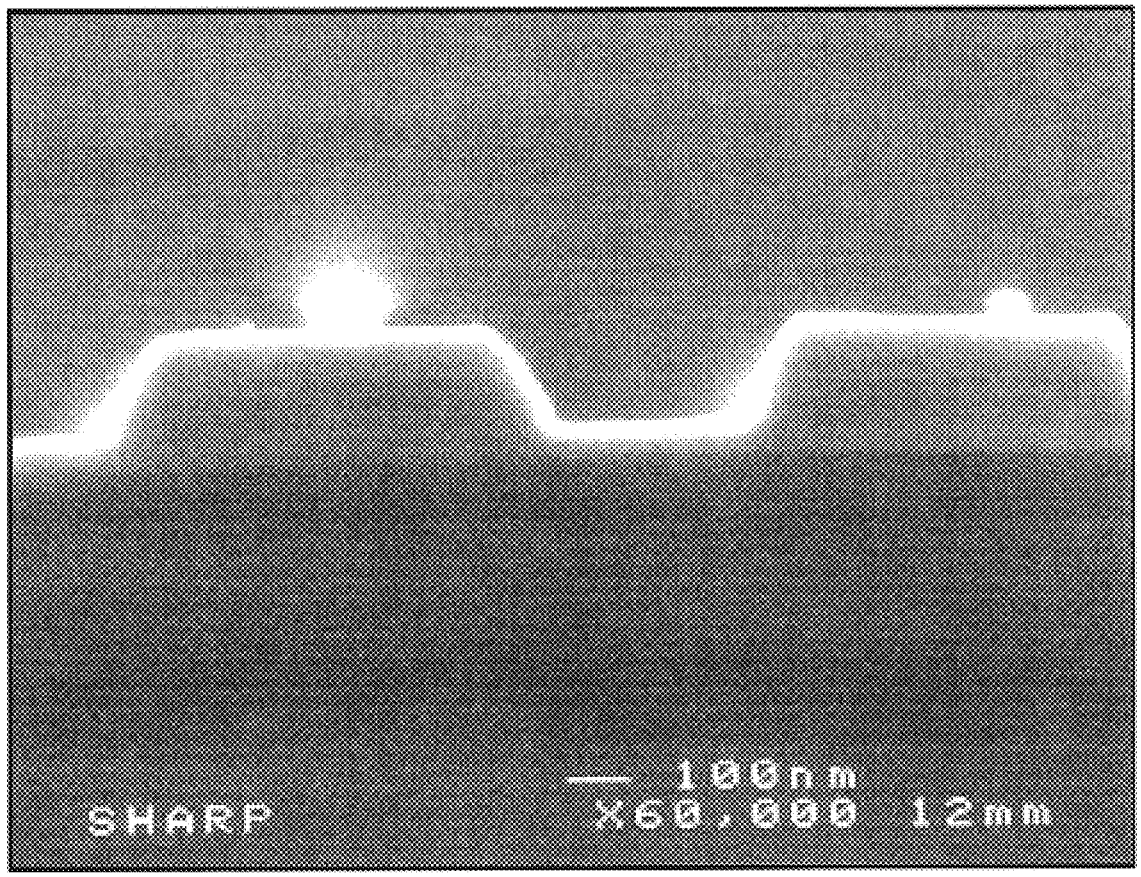
Figure 4:
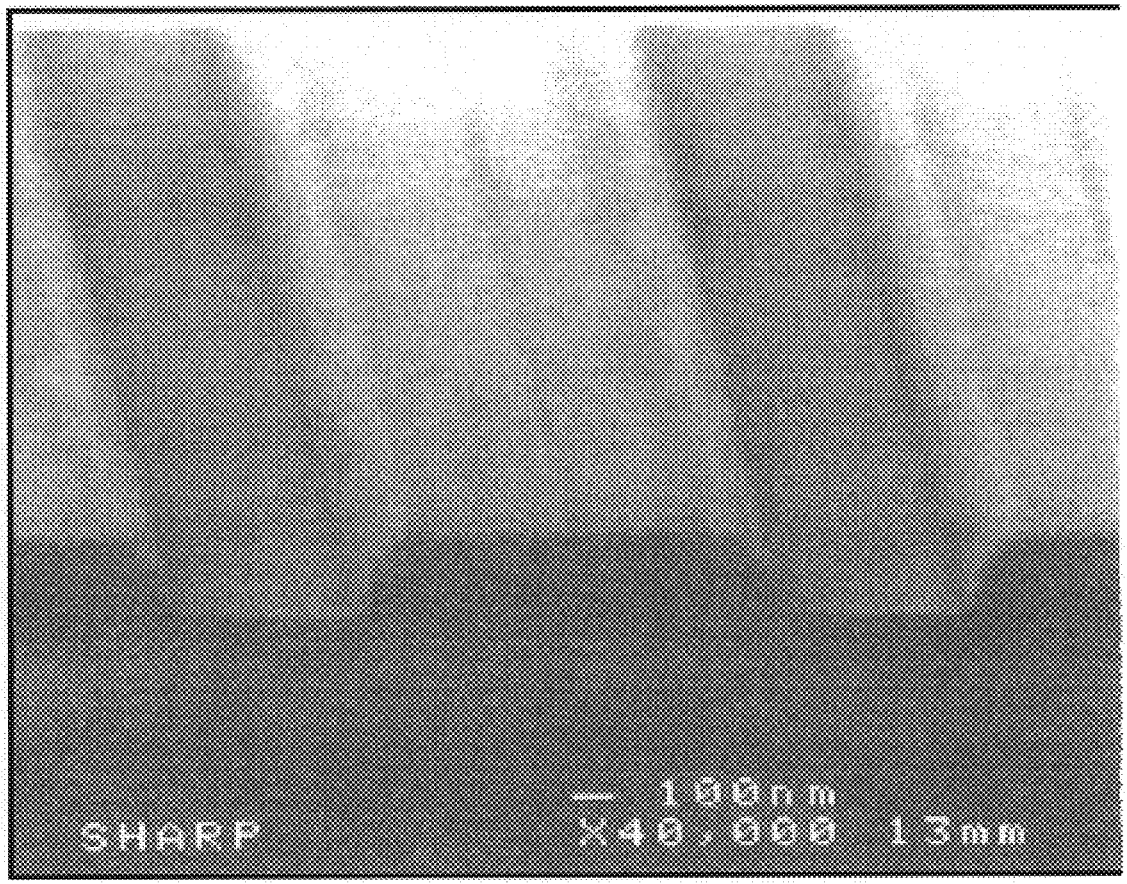

FIGS. 2–4 depict SEM photos of Ir-Ta-O electrode structures, or electrode elements, following plasma etching and post-etch cleaning. A water rinse in hot deionized (DI) water, at a temperature of about 80° C., completely dissolves the etch-induced sidewall residue, also referred to as "fences." To obtain the results of FIGS. 2 and 3, the etch gases used were $CF_4/O_2/Ar$ having flow rates of 30 sccm/5 sccm/25 sccm, or, a total etch gas flow rate of 60 sccm. The post etch cleaning was in 80° C. DI water for 20 minutes. In the case of FIG. 4, the etch gases used were $CF_4/O_2/Ar$ having flow rates of 30 sccm/5 sccm/5 sccm. The post etch cleaning was in 80° C. DI water for 100 minutes.

To summarize, plasma etching is used to pattern the Ir-Ta-O electrode material in a ferroelectric device. A fluorine-containing etch gas is used to increase the etch rate of the Ir-Ta-O material. Finally, a hot DI water wash is used as a post etch cleaner to dissolve any post-etch induced sidewall residue. Thus, a method of plasma etching of Ir-Ta-O electrode and post-etch cleaning has been disclosed. It will be appreciated that further variations and modifications thereof may be with the scope of the invention as defined in the appended claims.

We claim:

1. A method of forming an electrode in an integrated circuit comprising:
   preparing a silicon-base substrate, including forming semiconductor structures on the substrate to form an integrated substrate structure;
   depositing a layer of Ir-Ta-O electrode material on a substrate structure; and
   patterning the layer of Ir-Ta-O electrode material to form electrode elements, wherein said patterning includes plasma etching the layer of electrode material in a plasma reactor in an etching gas atmosphere having a fluorine component therein.

2. The method of claim 1 wherein said preparing includes forming a ferroelectric semiconductor structure.

3. The method of claim 1 wherein said patterning includes preparing an etch gas having a fluorine component, an oxygen component and an inert component.

4. The method of claim 1 wherein said etching includes selecting a fluorine etch gas component taken from the group of components consisting of $CF_4$, $CHF_3$, $C_2F_6$, $SF_6$ and $NF_3$.

5. The method of claim 1 wherein said etching includes preparing an etch gas mixture of $CF_4/O_2/Ar$ and delivering the mixture at a flow rate of about 60 sccm, including $CF_4$ at about 30 Sccm, $O_2$ at about 5 sccm and Ar at about 25 sccm, at a process pressure of about 6 mTorr, a microwave power of about 600 W, a substrate RF bias power of about 200 W at ambient room temperature.

6. The method of claim 1 which further includes cleaning the substrate structure and electrode elements in a deionized water bath at about 80° C. for between about 20 minutes and 100 minutes.

7. The method of claim 1 wherein said etching includes preparing an etch gas having a fluorine component and delivering the mixture at a flow rate in a range of between about 20 sccm to 100 sccm, at a process pressure in a range of between about 5 mTorr to 50 mTorr, a microwave power in a range of between about 300 W to 1000 W, a substrate RF bias power in a range of between about 50 W to 1000 W, and at a temperature in a range of between about −50° C. to 200° C.

8. A method of forming an electrode in an integrated circuit comprising:
   preparing a silicon-base substrate, including forming semiconductor structures on the substrate to form an integrated substrate structure;
   depositing a layer of electrode material on a substrate structure;
   patterning the layer of electrode material to form electrode elements, wherein said patterning includes plasma etching the layer of electrode material in a plasma reactor in an etching gas atmosphere having a fluorine component therein, including preparing an etch gas mixture of $CF_4/O_2/Ar$ and delivering the mixture at a flow rate of about 60 sccm, including $CF_4$ at about 30 scc $O_2$ at about 5 sccm and Ar at about 25 sccm, at a process pressure of about 6 mTorr, a microwave power of about 600 W, a substrate RF bias power of about 200 W at ambient room temperature; and
   cleaning the substrate structure and electrode elements in a deionized water bath at about 80° C. for between about 20 minutes and 100 minutes.

9. The method of claim 8 wherein said depositing includes depositing a layer of Ir-Ta-O electrode material.

10. The method of claim 8 wherein said preparing includes forming a ferroelectric semiconductor structure.

11. The method of claim 8 wherein said patterning includes preparing an etch gas having a fluorine component, an oxygen component and an inert component.

12. The method of claim 8 wherein said etching includes selecting a fluorine etch gas component taken from the group of components consisting of $CF_4$, $CHF_3$, $C_2F_6$, $SF_6$ and $NF_3$.

13. The method of claim 8 wherein said etching includes preparing an etch gas having a fluorine component and delivering the mixture at a flow rate in a range of between about 20 sccm to 100 sccm, at a process pressure in a range of between about 5 mTorr to 50 mTorr, a microwave poster in a range of between about 300 W to 1000 W, a substrate RF bias power in a range of between about 50 W to 1000 W, and at a temperature in a range of between about −50° C. to 200° C.

14. A method of forming an electrode in an integrated circuit comprising preparing a silicon-base substrate, including forming semiconductor structures on the substrate to form an integrated substrate structure;
   depositing a layer of Ir-Ta-O electrode material on a substrate structure;
   patterning the layer of Ir-Ta-O electrode material to form electrode elements, wherein said patterning includes etching the layer of electrode material in a plasma reactor in an etching gas atmosphere having a fluorine component therein, including a fluorine etch gas component taken from the group of components consisting of $CF_4$, $CHF_3$, $C_2F_6$, $SF_6$ and $NF_3$; wherein said etching further includes delivering the etch gas mixture at a flow rate in a range of between about 20 sccm to 100 sccm, at a process pressure in a range of between about 5 mTorr to 50 mTorr, a microwave power in a range of between about 300 W to 1000 W, a substrate RF bias power in a range of between about 50 W to 1000 W, and at a temperature in a range of between about −50° C. to 200° C.; and
   cleaning the substrate structure and electrode elements in a deionized water bath at about 80° C. for between about 20 minutes and 100 minutes.

15. The method of claim 14 wherein said preparing includes forming a ferroelectric semiconductor structure.

16. The method of claim 14 wherein said patterning includes preparing an etch gas having a fluorine component, an oxygen component and an inert component.

17. The method of claim 14 wherein said etching includes preparing an etch gas mixture of $CF_4/O_2/Ar$ and delivering the mixture at a flow rate of about 60 sccm, including $CF_4$ at about 30 sccm, $O_2$ at about 5 sccm and Ar at about 25 sccm, at a process pressure of about 6 mTorr, a microwave power of about 600 W, a substrate RF bias power of about 200 W at ambient room temperature.

* * * * *